(12) United States Patent
Farber et al.

(10) Patent No.: US 6,232,134 B1
(45) Date of Patent: May 15, 2001

(54) METHOD AND APPARATUS FOR MONITORING WAFER CHARACTERISTICS AND/OR SEMICONDUCTOR PROCESSING CONSISTENCY USING WAFER CHARGE DISTRIBUTION MEASUREMENTS

(75) Inventors: David Gerald Farber; Wei E. Wu; Phillip E. Crabtree, all of Austin, TX (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/490,125

(22) Filed: Jan. 24, 2000

(51) Int. Cl.$^7$ .................................................. H01L 21/00
(52) U.S. Cl. ................................. 438/9; 156/345; 216/59; 438/14; 438/710
(58) Field of Search .................... 438/8, 9, 14, 710, 438/737; 216/59, 60, 79; 156/345 MT, 345 P (56) References Cited

U.S. PATENT DOCUMENTS 4,859,277 * 8/1989 Barna et al. ....................... 438/9 X
6,054,333 * 4/2000 Bensaoula ............................ 438/9
6,060,329 * 5/2000 Kamata et al. ....................... 438/9

* cited by examiner

Primary Examiner—William Powell (57) ABSTRACT

A method and apparatus for characterizing processing operations is presented. Following exposure of a wafer to plasma, the surface charge distribution pattern on the wafer is measured. The surface charge distribution pattern on the wafer is then compared with known surface charge distribution patterns to determine if the measured charge distribution pattern correlates to desirable patterns associated with successful performance of one or more processing steps. In some embodiments, the comparison of the measured charge distribution pattern can be used to detect specific problems in one or more processing steps such that corrective action can be taken in a timely manner. The comparison between the measured charge distribution pattern and known charge distribution patterns may be performed using image comparison or using quantitative comparisons based on charge levels measured within each pattern.

40 Claims, 4 Drawing Sheets

METHOD AND APPARATUS FOR MONITORING WAFER CHARACTERISTICS AND/OR SEMICONDUCTOR PROCESSING CONSISTENCY USING WAFER CHARGE DISTRIBUTION MEASUREMENTS

FIELD OF THE INVENTION

The invention relates generally to semiconductor manufacturing, and more particularly to using charge distribution patterns collected from semiconductor wafers to monitor wafer processing consistency and/or accuracy and qualify IC processes.

BACKGROUND OF THE INVENTION

Integrated circuits are typically formed on a substrate such as a silicon wafer using a number of processing steps. Such processing steps include steps such as etching steps that remove selected portions of material deposited on the wafer. In order to consistently produce functional integrated circuits, the processing steps such as etching steps must be performed in a consistent manner.

In order to monitor process step characteristics such as etching rates, prior art systems often required patterned test wafers to be processed and then cross-sectioned to determine how the processing steps are currently being performed. In one prior art system, different portions of the wafer are isolated through cross-sectioning and manually measured using devices such as micrometers in order to determine the rate of etching. Such prior art systems require intense manual operations that are time consuming and inefficient. In addition to this drawback, such prior art systems often only provide data for isolated portions of the overall wafer such that a complete view of the performance of the processing operation with respect to the entire wafer is not achieved.

Other prior art systems utilized large via holes (on the order of 0.5 micron) which are visually examined after processing to determine etching rates. Because actual geometries of circuit elements in integrated circuits processed based on current technology are significantly smaller than the fairly large geometries associated with the via holes used for visual inspection, the etching rate may not be accurately determined for the smaller geometry features. This is because features having larger geometries are often etched at a rate that differs significantly than that for features of smaller geometries. In other words, the rate of etching in a large gap may occur at a faster rate than the etching rate in smaller gaps. This prior art technique also suffers from requirement that manual measurements must be performed, thus increasing the cost associated with the process and reducing both accuracy and practicality.

Other prior art systems included a special layer such as a titanium nitride layer below the material being etched. If, following the etching process, the special layer had not been reached, a visual inspection would reveal that the etching rate was less than expected. If the special layer could be visually observed following etching, it could be determined that the etching rate was sufficient to etch through the amount of material overlying the special layer. Unfortunately, such a coarse level of etch rate analysis is often inadequate to accurately characterize the etching rate to a point that it is beneficial promoting proper processing operations.

Each of the prior art techniques discussed thus far are time consuming to the point where they are often performed on an infrequent basis. In some cases, the etching rate would only be monitored on a bi-weekly basis. As such, problems that arose between points of measurement could persist for days without corrective measures being taken. Because wafers are often processed at a high rate in factories that operate around the clock, this could result in a significant number of faulty integrated circuits being produced.

As is known in the art, charge measurement instruments have been designed for measuring charge distributions on the surface of a wafer. Such charge distributions are often a result of processing steps that cause a static charge to be built up on the surface of the wafer. Such a static charge can be measured through a measurement based on capacitance that determines the charge distribution across the surface of the wafer. Although such charge monitoring capacity is currently known, it has only been used to monitor damage that may have been induced to various structures and the integrated circuits due to charge gradients or concentrations.

Therefore, a need exists for a method and apparatus for monitoring performance of processing steps such as etching rates in a manner that requires less manual interaction, produces more accurate results, and which can be performed in a fast and efficient manner such that more frequent monitoring can be performed in a cost effective manner.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

DETAILED DESCRIPTION

Generally, the present invention provides a method and apparatus for characterizing processing operations that may be used in conjunction with wafer processing in order to ensure that the processing steps are performed within acceptable guidelines. Following exposure of a wafer to plasma, the surface charge distribution pattern on the wafer is measured. The surface charge distribution pattern on the wafer is then compared with known surface charge distribution patterns to determine if the measured charge distribution pattern correlates to desirable patterns associated with successful performance of one or more processing steps. In some embodiments, the comparison of the measured charge distribution pattern can be used to detect specific problems in one or more processing steps such that corrective action can be taken in a timely manner. The comparison between the measured charge distribution pattern and known charge distribution patterns may be performed using image comparison or using quantitative comparisons based on charge levels measured within each pattern.

Figure 1:
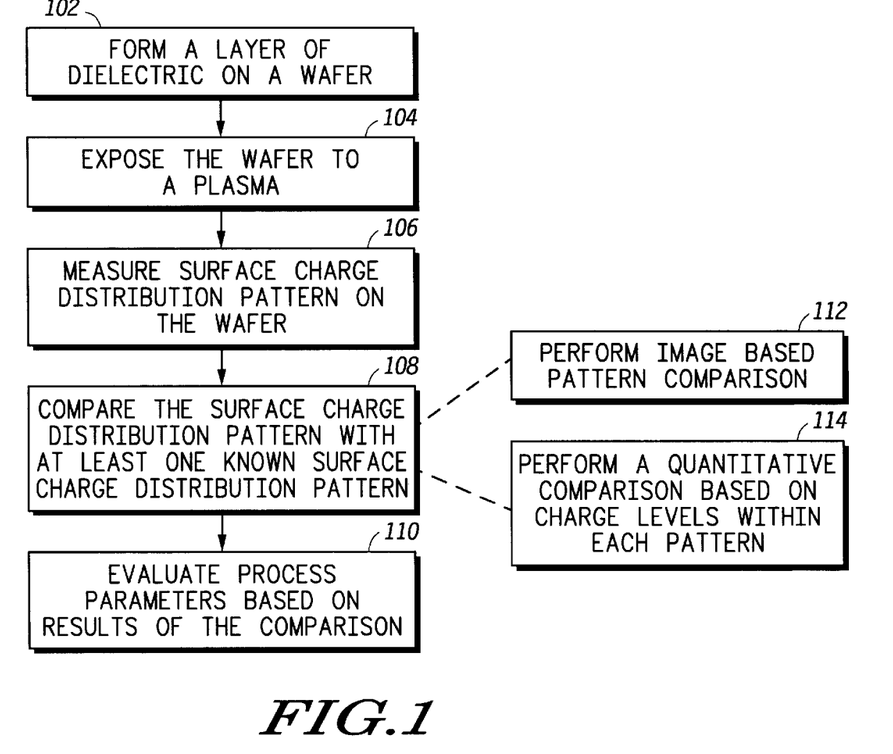
FIG. 1 illustrates a flow diagram of a method for evaluating process in accordance with a particular embodiment of the present invention.

The invention can be better understood with reference to FIGS. 1–6. FIG. 1 illustrates a method for evaluating process parameters associated with one or more processing steps that may be included in the processing of a substrate, such a wafer, upon which semiconductor integrated circuits are manufactured. Typically, the wafer upon which the steps of the method of FIG. 1 are performed is a monitor wafer or a test wafer that is not a production wafer that includes integrated circuits, but rather a wafer that is processed along with production wafers to allow various processing steps to be monitored.

The method begins at step 102 where a layer of dielectric, or dielectric film, is formed on the wafer. The dielectric layer may be formed through deposition or through a process where the dielectric is grown on the surface of the wafer. The dielectric is preferably a material that has favorable charge retention characteristics such that measurements of retained charge on the surface of the wafer can be performed at various times following processing steps without substantially affecting the measured results. One such material that has favorable charge retention characteristics is a thermal oxide that includes silicon such as thermally grown silicon dioxide, which is commonly used as a gate dielectric in semiconductor integrated circuits. Other example dielectric layers include semiconductive films, polymers, nitride layers such as silicon nitride layers, and photoresist layers.

At step 104, the wafer is exposed to plasma or some other charge-comprising environment. Such exposure may be performed in a processing tool that supports both collection of charge data and etching operations. Exposure to plasma in semiconductor processing operations is typically associated with etching operations, cleaning operations, or deposition operations. Exposure of the wafer to plasma at step 104 results in surface charge being induced on the wafer. The characteristics of the various levels of charge distributed at various points on the surface of the wafer, may be influence by a number of variables. Such variables include variables associated with the processing step that requires exposure of the wafer to plasma. Such processing steps typically are performed within a plasma chamber, radio frequency (RF) power used to generate and sustain the plasma, and variables associated with gas flow into the plasma chamber, the type of gas used in the plasma chamber, pressurization of the plasma chamber, the wafer position with respect to other portions of the plasma chamber, and those variables associated with the electric fields that are generated for guiding the plasma within the plasma chamber may all have differing effects on the distribution of charge on the surface of the wafer.

In addition to the variables associated with the exposure to plasma, variables associated with the composition of the wafer at the time of exposure to the plasma may also influence the charge distribution pattern across the surface of the wafer. Such wafer dependent parameters may include the various types of materials included at various points on the wafer, general wafer topography, and specific geometrical structures formed at differing points on the wafer surface.

At step 106, the surface charge distribution pattern on the wafer is measured or scanned. This step of collecting plasma charge data from the surface of the wafer or substrate can be used to provide an indication as to the successful or unsuccessful performance of various processing steps used to process the wafer. In one embodiment, the plasma charge data can be used to determine etching characteristics of a given process step, where the etching characteristics may correspond to one of the charge retention materials described above. In another embodiment, the plasma charge data may be used to determine deposition characteristics of a given process step.

Charge measurement devices that are capable of measuring the surface charge distribution pattern on the wafer are currently known in the art, but as indicated earlier, are only known to be used for detecting charge aberrations that may result in damage to circuit components on the wafer. The plasma charge data that is measured at step 106 may include at least one discrete point of data measured from the surface of the substrate, and may further include a plurality of charge data points measured across the surface of the substrate to obtain the charge distribution pattern.

At step 108 the surface charge distribution pattern measured at step 106 is compared with at least one known charge distribution pattern. Preferably, the known charge distribution pattern is stored in a computer readable medium. The reference charge data included in the reference charge distribution patterns may be charge data collected from one or more previous wafers processed using the method, or may be data collected from a single master reference substrate. The known charge distribution pattern may be associated with a desirable reference charge distribution pattern that, if a positive comparison is determined, indicates that the processing step(s) being monitored has been performed successfully. In other embodiments, charge distribution patterns compared at step 108 may include those associated with problem reference charge distribution patterns such that variations in the charge distribution pattern associated with specific errors or faults at various points in the processing process can be recognized.

Figure 2:
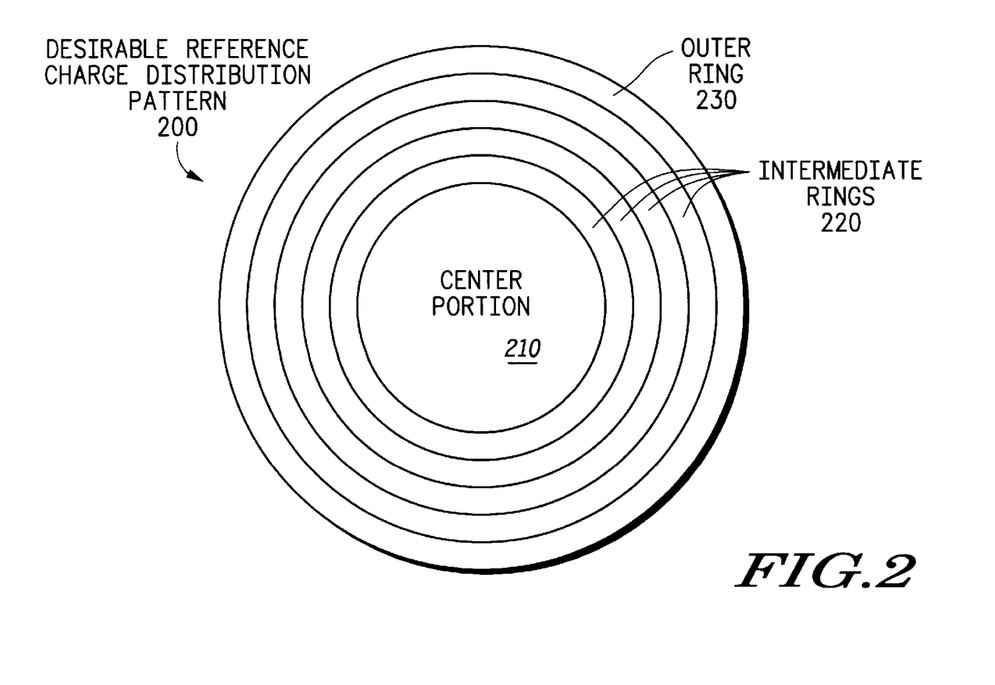
FIG. 2 illustrates a graphical representation of a desirable reference charge distribution pattern in accordance with a particular embodiment of the present invention.
Figure 3:
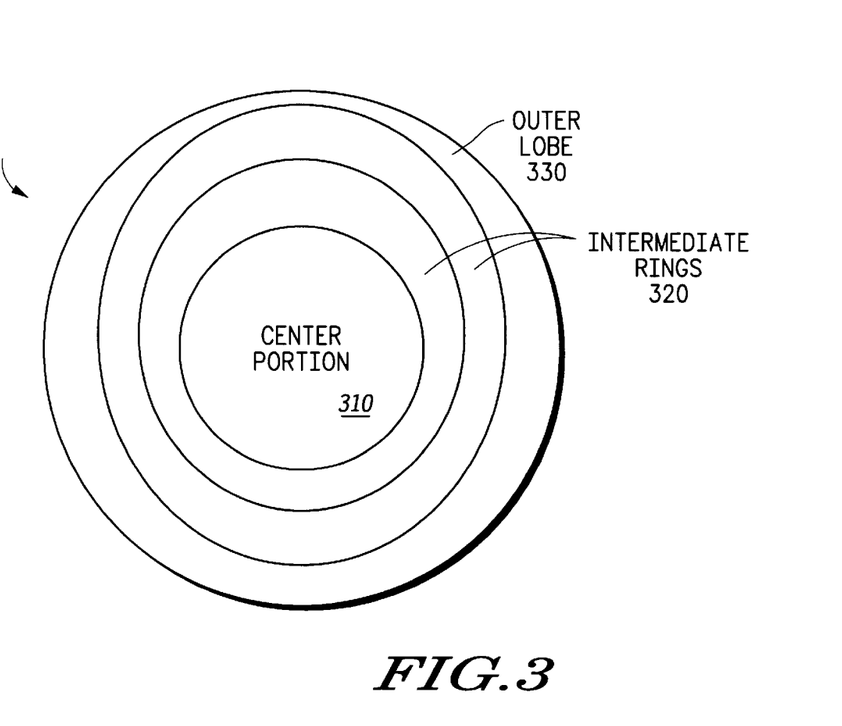
FIG. 3 illustrates a graphical representation of a problem reference charge distribution pattern in accordance with a particular embodiment of the present invention.
Figure 4:
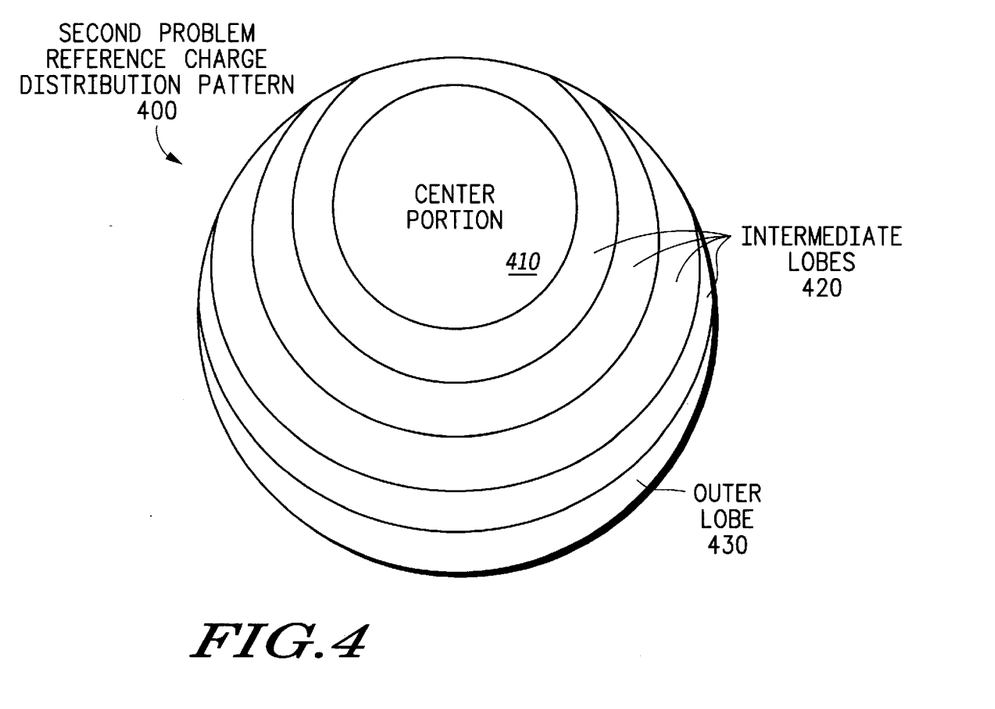
FIG. 4 illustrates a graphical representation of another problem reference charge distribution pattern in accordance with a particular embodiment of the present invention.

Step 108 may be performed as illustrated at step 112 by performing an image based pattern comparison (optical pattern recognition process) between the surface charge distribution pattern that has been measured and known surface charge distribution patterns. By generating images corresponding to various charge distribution patterns, the images can be visually compared manually or compared using an image processing circuit or similar device in order to determine if aberrations in the images or other unexpected variations have occurred. FIGS. 2–4 provide graphical representations of various surface charge distribution patterns that may be used to aid in understanding the image based comparison process.

FIG. 2 illustrates a desirable reference charge distribution pattern 200 that may be associated with an expected charge distribution pattern following exposure of a wafer to plasma, such as occurs in a plasma etching step. In the example desirable reference charge distribution pattern 200 illustrated, the center portion 210 includes the portion of the wafer within which the highest charge density exists. The outer ring 230 indicates a portion of the wafer where the lowest charge density is measured, and the intermediate rings 220 provide various gradients of charge density between that in the center portion 210 and that at the outer ring 230. As is illustrated in FIG. 2, the various gradients are generally centered about the center portion 210 and occur at generally regular radial intervals.

FIG. 3 illustrates a graphical representation of a first problem reference charge distribution pattern 300, which may also be referred to as a problem charge distribution. As illustrated, the center portion 310 of the charge distribution pattern 300 is significantly larger in area than the center portion 210 of the desirable reference charge distribution pattern 200 of FIG. 2. This may indicate that some type of process shift has occurred that results in increased charge density at the center portion 310. Note that the general shapes of the outer lobe 330 and the intermediate rings 320 are also distorted such that they do not match the general concentric pattern associated with the intermediate rings 220 and outer ring 230 of the desirable reference charge distribution pattern 200 of FIG. 2. Although such distortions may be caused by numerous factors, they are indicative of some deviation in the processing procedure that may be detected in order to flag a problem that may be corrected.

FIG. 4 illustrates a second problem reference charge distribution pattern 400 that may be associated with a mis-positioning of a wafer during a processing step. The error in positioning has shifted the center portion 410 to a location within the wafer that is non-central. In addition to the repositioning of the center portion 410, the charge density gradients associated with the intermediate lobes 420 and the outer lobe 430 are distorted in a manner that would likely result from an error in wafer positioning.

Note that visual inspection of the various charge distribution patterns illustrated in FIGS. 2–4 may make potential processing problems readily apparent to either a human observer or an image processing device. Thus, in a wafer fabrication facility, an operator could perform a quick visual inspection of the surface charge distribution pattern measured at step 106 in FIG. 1 to determine if it matches the desirable reference charge distribution pattern illustrated in FIG. 2. Any deviation in the general pattern could alert such an operator to a potential problem in the processing operations. Assuming that a number of reference charge distribution patterns have been recorded and cataloged, those problem reference charge distribution patterns associated with specific process step deviations or failures could be recognized to allow timely notification of such problems. As such, the problems can be corrected expediently before a significant number of wafers that include production integrated circuits are subjected to the deviate processing steps.

In other embodiments of the invention, step 108 may be performed by performing quantitative comparison of the various charge levels within each of the surface charge distribution patterns at step 114. In one example, the average charge density (average distribution of charge) may be determined across the entire wafer and compared with previous average charge density measurements associated with favorably processed wafers. In addition to an average charge density across the entire wafer, the standard deviation of such charge density with respect to the entire wafer may be calculated such that the difference between the charge density at one portion of the wafer where the charge density is the greatest can be compared with the charge density associated with another portion of the wafer where the charge density is at its least dense level. Utilization of the standard deviation along with average charge density can provide a good measurement as to the distribution of charge across the entire wafer.

Note that in other embodiments, the quantitative comparison performed at step 114 may include comparing the charge density at various predetermined locations with expected charge densities at those locations. Another quantitative comparison may include comparing a maximum charge level in the charge distribution pattern as measured with a maximum quantity of charge, or charge level, associated with reference charge data in the desirable reference charge distribution pattern. Similarly, the minimum quantity of charge in the plasma charge data measured may be compared with the minimum quantity of charge in the reference charge data.

The comparison step performed at step 108 may be divided into numerous segments such that different segments of the charge distribution pattern are compared with different segment reference patterns through individual comparisons. Thus, charge density levels within different portions of the wafer may be compared individually with corresponding reference data. Such segment level comparisons can be used to determine whether the etching rate characteristics or other processing step characteristics are appropriate at different portions of the wafer surface.

In one embodiment, the wafer is divided into a plurality of segments that are assigned on a cylindrical basis such that each segment resembles a ring such as the center portion 210, intermediate rings 220, and outer ring 230 illustrated in FIG. 2. In other embodiments, the segments may be assigned in a rectangular fashion such that various blocks within the surface charge distribution pattern are characterized and compared individually with similar blocks in a reference pattern. As is apparent to one of ordinary skill in the art, the surface charge distribution pattern may be separated into a number of segments of various shapes where the shapes may be designed based on the specific embodiment or system.

The quantitative comparison performed at step 114 may include comparing the quantitative values such as an average charge value or standard deviation with specific tolerance values associated with the processing step. If the comparison step produces a comparison value that is within the tolerance range, the wafer may be deemed acceptably processed, whereas if the comparison value is outside of the tolerance value, the substrate may be deemed to be unacceptably processed. For example, if the average charge density across the wafer is above a maximum average charge density or below a minimum average charge density, the wafer will be deemed unacceptably processed, whereas if the average charge density is within the range between the maximum and minimum, the wafer will be deemed acceptably processed.

The comparison step performed at step 108 may be refined based on additional feedback received from processed charge monitor wafers. Thus, if repeated use of the method illustrated in FIG. 1 produces resulting wafers that included integrated circuits that provide additional detail as to the correlation of the measured charge distribution on the wafer to the production of functional integrated circuits, the comparison step performed at step 108 may be adapted. Such adaptation may improve the comparison step such that functional integrated circuits are more likely to be produced using the process step(s) monitored through the execution of the method of FIG. 1. Thus, the comparison may be adjusted in accordance with substrate integrated circuit yield data to adjust comparison rules in a manner that improves yield.

Finally, at step 110 process parameters are evaluated based on the result of the comparison. This may include determining whether etching characteristics associated with the processing step being monitored are acceptable. Characterization of the etching characteristics may include determining a uniformity of an etch rate across the substrate, or determining the selectivity of the etch rate across the substrate. In some example applications, the etching characteristics may be used to determine if a profile of a via has been properly etched, if the topography of the surface of the substrate is acceptable, to calibrate an etch chamber to an acceptable initial condition, to determine microloading etch characteristics associated with etching a material on a substrate, and to correlate etching operations in two or more etching chambers such that the chambers process substrates with close consistency.

If the comparison performed at step 108 indicates that the processing steps performed have been performed in an acceptable manner, the current configuration of the processing equipment may be maintained such that future wafers processed in a similar manner are likely to be processed in an acceptable manner. However, if the results of the comparison at step 108 indicate that deviations exists within the process parameters that are undesirable, processing steps or equipment may be modified or adjusted and additional evaluation performed prior to subsequent processing of production wafers.

The use of measured charge distribution patterns to detect deviation in processing steps is often more sensitive to process deviations than prior art techniques that rely on physical measurements taken manually. Materials that retain charge well allow the charge density patterns to remain stable over a relatively significant length of time. For example, thermal oxide has been shown to provide stable charge densities for periods on the order of hours. Because the charge is fairly stable on the wafer over a relatively significant length of time, the use of the charge distribution pattern comparisons for process characterization is practical for implementation in a manufacturing environment.

Figure 5:
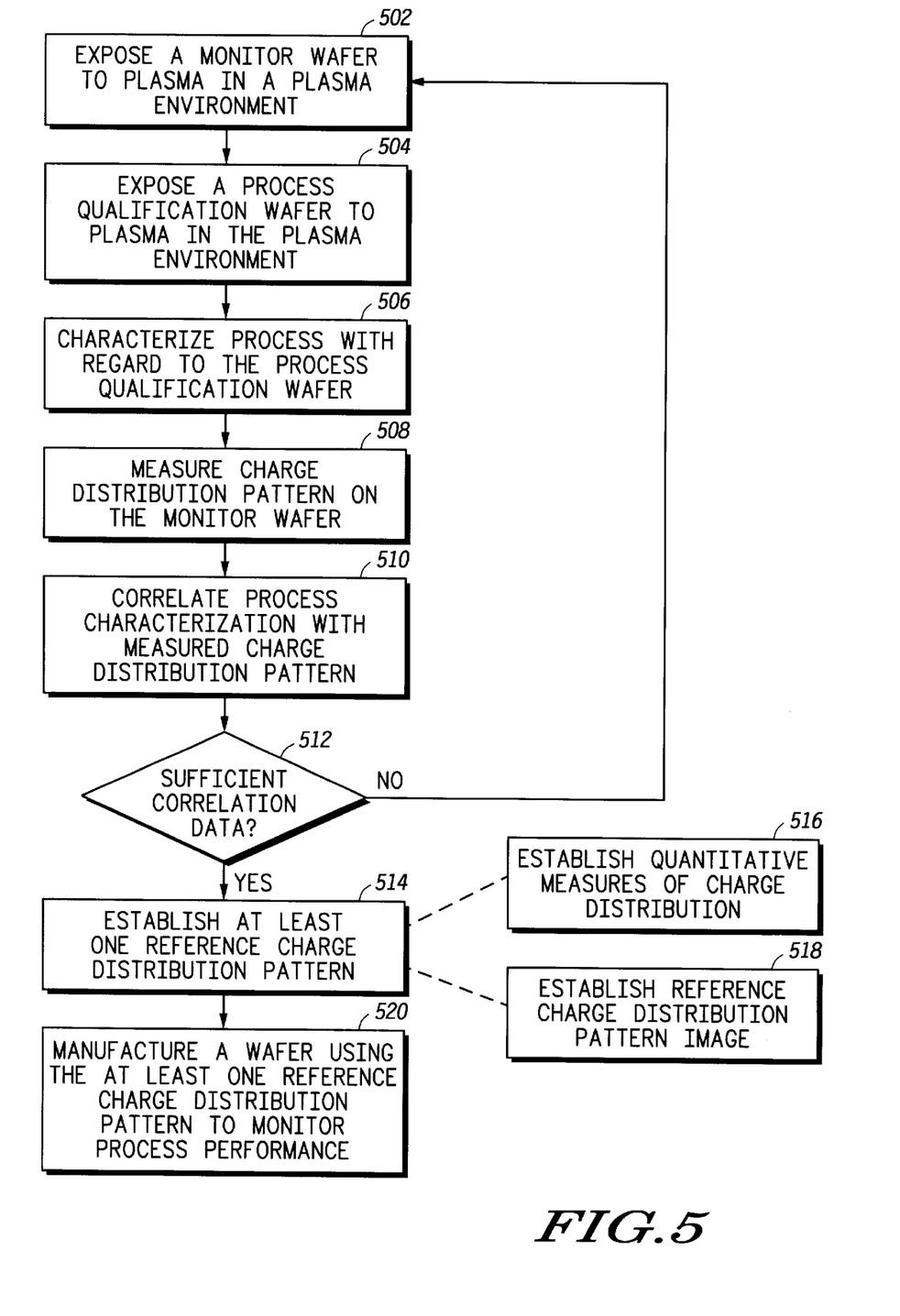
FIG. 5 illustrates a flow diagram of a method for manufacturing integrated circuits in accordance with a particular embodiment of the present invention.

FIG. 5 illustrates a flow diagram of a method for manufacturing wafers in a manner that includes comparing measured charge distribution patterns with reference charge distribution patterns to determine if processing steps are performed within set guidelines. The method begins at step 502 where a monitor wafer is exposed to plasma in a plasma environment. Preferably, the monitor wafer includes a layer of material that retains charge upon exposure to plasma such as thermal oxide or other dielectrics. The monitor wafer may be a wafer that is re-used for processing step characterization repeatedly, as the monitor wafer is not physically altered irreparably through the characterization process. In other words, after use in the process illustrated in FIG. 5, the oxide or other dielectric used to obtain a charge distribution pattern can be stripped off and a new unaltered layer deposited for subsequent charge distribution pattern capturing operations.

At step 504, a process qualification wafer is exposed to plasma in the plasma environment that is preferably the same plasma environment in which the monitor wafer was exposed. The process qualification wafer preferably includes structures that can be used to measure certain parameters corresponding to the process step being monitored. Such a process qualification wafer may include structures such as vias, contacts, or other structures that can be examined in a cross-sectional portion of the wafer to determine process characteristics such as etching rates.

At step 506, the process step being performed is being characterized with regard to the process qualification wafer. Note that various techniques can be used to perform the characterization at step 506. Such techniques may include both manual and automated techniques. In the example where the process qualification wafer includes vias or similar structures, the characterization step performed at step 506 may include cutting the wafer into cross sectional portions such that manual or automated measurements can be taken to determine the process parameters corresponding to the processing step. Such processing steps may include monitoring different variables with respect to steps such as etching steps. Such variables corresponding to the etching steps may include etching rates, uniformity of etching across the wafer, selectivity of etch rate across the wafer, and an etch profile across the wafer. Selectivity of etching may include determining an etching rate with respect to one material that is being etched and comparing the rate of etching for that material with the rate of etching of additional materials.

At step 508, the charge distribution pattern on the monitor wafer is measured. As described with respect to FIG. 1, the charge distribution pattern is preferably measured using a charge measurement instrument such as those currently known in the art.

At step 510, the process characterization performed at step 506 is correlated with the measured charge distribution pattern obtained at step 508. Because the monitor wafer and the process qualification wafer are both exposed to the plasma under similar conditions in the same plasma environment, the characteristics resulting in the process qualification wafer as determined at step 506 can be correlated with the charge distribution pattern measured on the monitor wafer at step 508. As such, if a subsequent monitor wafer were exposed to the plasma in the same environment and produced a similar charge distribution pattern, a subsequently exposed process qualification wafer exposed to the plasma in the same environment should produce similar process parameter characterization data as that determined for the process qualification wafer characterized at step 506.

In some instances, multiple process qualification wafers may have to be characterized in order to generate a sufficient data set to accurately correlate the process characterization with the different measured charge distribution patterns on different monitor wafers. Therefore, at step 512 it is determined whether or not sufficient correlation data has been obtained. If sufficient correlation data has not been obtained, the method returns at step 502 and the exposure, characterization, and charge distribution measurement steps are repeated iteratively until sufficient correlation data is determined to have been obtained at step 512.

Once sufficient correlation data has been obtained, the method proceeds to step 514 where at least one reference charge distribution pattern is established. Reference charge distribution patterns established at step 514 may correspond to desirable reference charged distribution patterns that indicate the charge distribution pattern which would be associated with proper performance of the processing steps. In other embodiments, the reference charge distribution patterns established at step 514 may correspond to one or more problem reference charge distribution patterns that are associated with different types of process parameter deviations that may be undesirable. Thus, the reference charge distribution patterns established at step 514 may be used in conjunction with the comparison step 108 of FIG. 1 to determine if subsequently processed monitor wafers have been processed in a manner that indicates that the processing steps are being performed acceptably.

The establishment of reference charge distribution patterns at step 514 may include the establishment of various quantitative measures of charge distribution at step 516. Thus, step 516 may include the determination of minimum and maximum average charge densities across the wafer, minimum and maximum standard deviations with respect to charge density on the wafer, or similar quantitative thresholds or ranges that can be used for characterization of process performance for subsequently processed wafers.

In other embodiments, the establishment of reference charge distribution patterns at step 514 may include the establishment of reference charge distribution pattern images at step 518. Step 518 may include generating a number of images that correspond to both desirable and problem reference charge reference distribution patterns. These charge distribution pattern images can then be used for manual visual comparison operations or automated image comparisons such that process deviations can be detected.

Once the reference charge distribution pattern(s) have been established at step 514, the method proceeds to step 520 where at least one wafer is manufactured using one or more of the reference charge distribution patterns established at step 514 to monitor process performance at one or more processing steps. Thus, at some subsequent point in time, a monitor wafer can be processed to determine if the processing operations are being performed within acceptable thresholds. Assuming that acceptable thresholds are achieved, a wafer that includes integrated circuits may be processed using the processing operations that have been judged acceptable.

By periodically monitoring the processing operation performance, manufactured wafers are more likely to produce functional integrated circuits. This is in contrast to prior art systems that were only able to monitor processing operation performance at less frequent intervals because of the overhead associated with the characterization of the processing steps. By characterizing processing step performance utilizing charge distribution patterns, a relatively insignificant amount of time is required to perform the periodic characterizations. As such, the characterizations can be performed more often, thus resulting in a better controlled processing environment.

Figure 6:
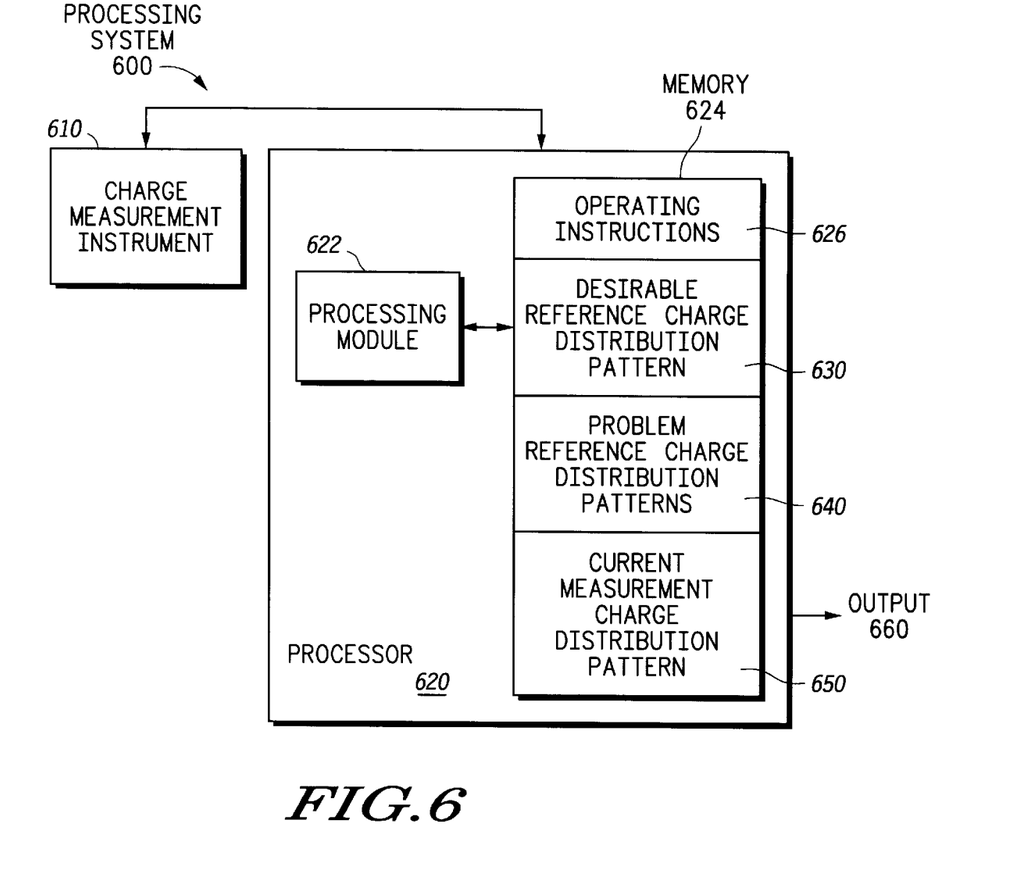
FIG. 6 illustrates a block diagram of a processing system that may be used in conjunction with integrated circuit manufacturing in accordance with a particular embodiment of the present invention.

FIG. 6 illustrates a processing system 600 that may be used for manufacturing integrated circuits on substrates such as silicon wafers. The processing system 600 includes a charge measurement instrument 610 that is operatively coupled to processor 620. The charge measurement instrument 610 may be referred to as a substrate processing tool. The charge measurement instrument 610 may be a Kelvin probe or a Monroe probe that detects a change in capacitance to measure a charge distribution across the surface of the wafer. The probe may provide a circular map that includes a number of rings, where the number of rings may be four. Such a circular mapping may be repeated at multiple points around the wafer, and in one embodiment 3,400 points are effectively mapped. Such charge measurement instruments are known to be used for measuring charge damage where such charge damage can result in altered gate voltage thresholds for transistors included in integrated circuits formed on the wafer.

The processor 620 includes a processing module 622 and memory 624. The processing module may be a single processing entity or a plurality of processing entities. Such a processing entity may include a microprocessor, microcontroller, digital signal processor, state machine, collection of logic circuitry, or any other processing entity that executes operational instructions to perform a set of functions.

The memory 624 may be a single memory device or a plurality of memory devices. Such memory devices may include random access memory, or other memory structures that when combined provide the capability of storing and retrieving data for processing. As is illustrated, the memory 624 includes operating instructions 626. When executed by the processing module 622, the operating instructions 626 cause the processing module 622 to perform a predetermined set of functions that include steps for characterizing processing parameters with regard to a wafer.

In order to perform the characterization of the processing steps, the memory 624 stores a desirable reference charge distribution pattern 630 which may correspond to a charge distribution pattern associated with acceptable processing methodology. In addition to storing the desirable reference charge distribution pattern 630, the memory 624 may also store one or more problem reference charge distribution patterns 640 that may be associated one or more known process methodology deviations that may be undesirable. Comparison with such problem reference patterns allows a determination as to whether a failure condition that occurred for another substrate has been repeated. Note that the reference charge distributions may be stored in any form of computer readable medium, and memory such as random access memory is only one example of how the reference charge distributions may be stored.

The memory 650 receives the current measured charged distribution pattern 650 for the wafer currently being monitored by the charge measurement instrument 610, and the processing module 622 performs a comparison between the current measured charge distribution pattern 650 and other charge distribution patterns stored within the memory 624. Based on the comparison performed, the processing module 622 determines a relationship between the current measured charge distribution pattern 650 and the reference patterns currently stored in the memory 624 to evaluate the processing operations performed on the wafer being monitored by the charge measurement instrument 610. Based on this comparison, the processor 620 generates an output 660.

The output 660 may be an automated control signal that alters processing operations currently being performed, a signal to an operator in the semiconductor processing environment, or any other indication that could be used to facilitate proper processing of wafers. Generally, the output 660 should provide some type of signal that generates corrective measures for potentially problematic processing operations. Depending on the array of problem reference charge distribution patterns 640 stored within the memory 624, various levels of expected responses could be determined.

In addition to providing the output 660, the processor 620 may catalog the current measured charge distribution pattern 650 as an additional problem reference charge distribution pattern if the current measured charge distribution pattern 650 is associated with a known process deviation or improperly processed substrate. In other words, the processor 620 can build its library of problem reference charge distribution patterns as it continues to monitor subsequent wafer processing performance.

In one embodiment, a multi-chamber processing tool that has a plurality of chambers may be used to perform both the processing step that deposits the charge and the charge measurement step. In such a processing tool, the wafer would be placed in the tool and processed in a first chamber to charge the surface of the wafer. The wafer could then be moved into a second chamber in a manner that does not break a vacuum condition such that the wafer is exposed to atmospheric pressure. Once in the second chamber, the charge distribution on the surface of the wafer could be measured. Once measured, the charge distribution could be used to perform future process monitoring associated with the processing tool.

The method and apparatus described herein provides a fast and efficient manner for detecting conformity with expected processing methodology and also a means for detecting aberrations from expected processing performance. Because the techniques described herein may be used in manufacturing environments, manufacturing operations can be fine-tuned or recalibrated at regular intervals without incurring significant additional costs. Frequent monitoring or recalibration helps to ensure that the manufacturing operations are performed within specified accepted tolerances such that the resulting manufactured wafers are more likely to include functional integrated circuits. By including feedback in the form of continued recognition of specific charge distribution patterns that are associated with either desirable or undesirable process performance, the techniques described herein are continually updated and refined such that their efficiency and usefulness may be improved over time. Real-time monitoring and control can be achieved with an active feedback loop to identify a new process condition in the database of charge patterns to ensure a consistent output.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for processing a substrate, the method comprising the steps of:
    collecting plasma charge data from a surface of the substrate; and
    using the plasma charge data to determine etching characteristics of a given process step.

2. The method of claim 1 wherein the plasma charge data is at least one discrete point of data measured from the surface of the substrate.

3. The method of claim 1 wherein the plasma charge data is a plurality of charge data points measured across the surface of the substrate to obtain a charge distribution pattern.

4. The method of claim 1 wherein the step of using comprises:
    comparing the plasma charge data to reference charge data stored in computer readable medium.

5. The method of claim 4 wherein the step of using comprises:
    comparing the plasma charge data to reference charge data stored in computer readable medium to determine whether the etching characteristics are acceptable.

6. The method of claim 5 wherein the etching characteristics include uniformity of an etch rate across the substrate.

7. The method of claim 5 wherein the etching characteristics include an etch rate across the substrate.

8. The method of claim 5 wherein the etching characteristics include a selectivity of the etch rate across the substrate.

9. The method of claim 5 wherein the reference charge data is a collection of data from one or more previous wafers processed using the method.

10. The method of claim 5 wherein the reference charge data is a collection of plasma data from a single master reference substrate.

11. The method of claim 5 wherein the comparing is performed by comparing an average distribution of charge of the plasma charge data to an average distribution of charge of the reference charge data.

12. The method of claim 5 wherein the comparing is performed by comparing a standard deviation of charge in the plasma charge data to a standard deviation of charge in the reference charge data.

13. The method of claim 5 wherein the comparing is performed by comparing at least one of a maximum quantity and a minimum quantity of charge in the plasma charge data to at least one of a maximum quantity and a minimum quantity of charge in the reference charge data.

14. The method of claim 5 wherein the comparing is performed by segmenting the plasma charge data into first segments of data and segmenting the reference charge data into second segments of data and uniformly processing and comparing data associated with the first and second segments to determine whether the etching characteristics are acceptable.

15. The method of claim 14 wherein both the first and second segments are cylindrically assigned based upon position on the substrate in a similar manner.

16. The method of claim 14 wherein both the first and second segments are assigned based upon a position on the substrate in a similar rectangular system.

17. The method of claim 5 wherein the comparing is performed by an optical pattern recognition process.

18. The method of claim 5 wherein the step of comparing results in a comparison value, whereby if the comparison value is within at least one tolerance, the substrate is deemed to be acceptably processed, whereas if the comparison value is outside the at least one tolerance, the substrate is deemed to be unacceptably processed.

19. The method of claim 5 wherein the step of comparing is adjusted in accordance with substrate integrated circuit yield data to adjust comparison rules to improve yield.

20. The method of claim 5 wherein the method stores the plasma charge data as defective plasma charge data when defective data is encountered by the step of comparing such that, if a similar defective data is encountered in a subsequent comparison operation a probable reason for process failure is determined.

21. The method of claim 1 wherein the etching characteristics correspond to etching of a dielectric film on the substrate.

22. The method of claim 1 wherein the etching characteristics correspond to etching of a charge retention material on the substrate.

23. The method of claim 1 wherein the etching characteristics correspond to etching of a semiconductive film on the substrate.

24. The method of claim 1 wherein the etching characteristics correspond to etching of a layer of polymer on the substrate.

25. The method of claim 1 wherein collecting the plasma charge data and etching corresponding to the etching characteristics are performed in a processing apparatus that supports both etching and charge data collection.

26. The method of claim 1 wherein the etching characteristics are used to determine when a profile of a via has been properly etched.

27. The method of claim 1 wherein the etching characteristics are used to determine when a topography of the surface of the substrate is acceptable.

28. The method of claim 1 wherein the etching characteristics are used to calibrate an etch chamber to an acceptable initial condition.

29. The method of claim 1 wherein the etching characteristics are used to determine microloading etch characteristics associated with etching of a material on the substrate.

30. The method of claim 1 wherein the etching characteristics are used to correlate a first etch chamber to a second etch chamber such that both the first and second etch chambers are processing substrates with close consistency.

31. A method for processing a substrate, the method comprising the steps of:

collecting plasma charge data from a surface of the substrate; and using the plasma charge data to determine deposition characteristics of a given process step.

32. A method for processing a substrate, the method comprising the steps of:

placing the substrate into a substrate processing tool;

using the substrate processing tool to measure a charge distribution across a surface of the substrate;

selecting a reference charge distribution from among a plurality of reference charge distributions stored in computer readable medium; and comparing the charge distribution to the reference charge distribution to determine whether the substrate processing tool properly processed the substrate.

33. The method of claim 32 further comprising:

storing, when the substrate processing tool improperly processes the substrate, the charge distribution in the computer readable medium as a problem reference charge distribution.

34. The method of claim 32 further comprising:

comparing, when the substrate processing tool improperly processes the substrate, the charge distribution with one or more problem reference charge distributions stored in the computer readable medium in an attempt to determine if a similar previous failure condition occurred for another substrate.

35. A method for processing a set of one or more wafers, the method comprising the steps of:

providing a test wafer into a processing tool;

exposing the test wafer to a charge-comprising environment in the processing tool whereby the charge-comprising environment forms a charge pattern on the test wafer;

measuring the charge pattern on the test wafer and using the charge pattern as measured to create a reference charge pattern stored in a computer readable medium;

placing the set of one or more wafers in the processing tool for processing;

exposing one or more of the wafers to the charge-comprising environment whereby the charge-comprising environment forms a charge pattern on the one or more wafers; and comparing the charge pattern collected from the one or more wafers with the reference charge pattern to determine if the one or more wafers was processed adequately.

36. The method of claim 35 wherein the one or more wafers contain product wafers with functional integrated circuits formed thereon, whereas other of the one or more wafers contain more test wafers for process monitoring.

37. The method of claim 35 wherein the test wafer is coated with a top dielectric layer.

38. The method of claim 37 wherein the test wafer is coated with a top thermal oxide layer comprising silicon.

39. A method for processing a substrate, the method comprising the steps of:

collecting a plurality of problem charge distribution patterns in computer readable medium and associating each of the problem charge distribution patterns with one or more faults that resulted in that problem charge distribution pattern;

scanning a subsequent monitor wafer to obtain a monitor charge distribution pattern; and comparing the monitor charge distribution pattern with one or more of the plurality of problem charge distribution patterns via a computer to determine if the monitor charge distribution pattern matches one of the plurality of problem charge distribution patterns whereby process correction may be expedited.

40. A method for processing a wafer, the method comprising the steps of:

placing the wafer into a processing tool having a plurality of chambers;

processing the wafer in a first chamber within the plurality of chambers to charge a surface of the wafer;

moving the wafer into a second chamber within the plurality of chambers, the moving being accomplished without breaking vacuum to atmospheric pressure;

measuring the charge distribution on the surface of the wafer in the second chamber; and using the charge distribution to perform future process monitoring associated with the processing tool.

* * * * *